(12) United States Patent
Zhang et al.

(10) Patent No.: US 9,326,420 B2
(45) Date of Patent: Apr. 26, 2016

(54) SERVER

(71) Applicant: Huawei Technologies Co., Ltd., Shenzhen, Guangdong (CN)

(72) Inventors: Zilin Zhang, Xi'an (CN); Ruifeng Shui, Shenzhen (CN); Bailin Long, Shenzhen (CN); Yangfan Zhong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 240 days.

(21) Appl. No.: 14/101,967

(22) Filed: Dec. 10, 2013

(65) Prior Publication Data

US 2014/0092541 A1 Apr. 3, 2014

Related U.S. Application Data

(63) Continuation of application No. PCT/CN2012/080603, filed on Aug. 27, 2012.

(30) Foreign Application Priority Data

Aug. 26, 2011 (CN) .......................... 2011 1 0249273

(51) Int. Cl.
*H02B 1/00* (2006.01)
*H02B 1/56* (2006.01)
(Continued)

(52) U.S. Cl.
CPC ............ *H05K 7/20145* (2013.01); *G06F 1/183* (2013.01); *G06F 1/20* (2013.01); *G06F 1/206* (2013.01); *H05K 7/20* (2013.01); *H05K 7/2039* (2013.01); *H05K 7/20536* (2013.01); *H05K 7/20554* (2013.01); *H05K 7/20709* (2013.01)

(58) Field of Classification Search
CPC ........... G06F 15/173; G06F 1/16; G06F 1/20; G06F 1/206; H01S 4/00; H05K 7/20; H05K 7/20145; H05K 7/2039; H05K 7/20536; H05K 7/20554; H05K 7/20709

USPC .............................. 361/679.5, 684, 676–678, 361/679.46–679.54, 688–723, 752, 760, 361/762, 831; 29/592.1; 709/223; 174/252, 174/520, 526; 312/223.1–223.3; 165/80.4, 165/104.33

See application file for complete search history.

(56) References Cited

U.S. PATENT DOCUMENTS 6,234,591 B1 5/2001 Driscoll et al.
2003/0051024 A1* 3/2003 Garnett .................. G06F 1/183
709/223

(Continued)

FOREIGN PATENT DOCUMENTS

| CN | 2541894 Y | 3/2003 |
|---|---|---|
| CN | 2650453 Y | 10/2004 |
| CN | 1852651 A | 10/2006 |
| CN | 2840601 Y | 11/2006 |
| CN | 201119214 Y | 9/2008 |
| CN | 102279633 A | 12/2011 |

*Primary Examiner* — Courtney Smith
*Assistant Examiner* — Zhengfu Feng

(57) ABSTRACT

Embodiments of the present invention disclose a server, and relate to the field of computer communications, so that maintainability of a server is improved, a heat dissipation function of the server is ensured, and heat dissipation reliability of the server is improved through online replacement of a heat dissipation fan and a server mainboard. A server includes: a chassis, a backplane with a ventilation opening, a rear board, a first air ducting apparatus, and at least one fan module, where the backplane is located in the middle of the chassis, and the rear board is connected to a rear side of the backplane in a pluggable manner; the fan module is disposed side by side with the rear board along a horizontal direction, and is connected to the rear side of the backplane in a pluggable manner.

9 Claims, 4 Drawing Sheets

(51) Int. Cl.
*H05K 7/20* (2006.01)
*G06F 1/20* (2006.01)
*H05K 5/00* (2006.01)
*H05K 1/00* (2006.01)
*A47B 81/00* (2006.01)
*G06F 1/18* (2006.01)

(56) References Cited

U.S. PATENT DOCUMENTS

2008/0174948 A1* 7/2008 Davis ............... G11B 3/127
  361/679.31
2014/0092541 A1  4/2014 Zhang et al.

* cited by examiner

SERVER

CROSS-REFERENCE TO RELATED APPLICATIONS

This application is a continuation of International Application No. PCT/CN2012/080603, filed on Aug. 27, 2012, which claims priority to Chinese Patent Application No. 201110249273.6, filed on Aug. 26, 2011, both of which are hereby incorporated by reference in their entireties.

TECHNICAL FIELD

The present invention relates to the field of computer communications, and in particular to a server.

BACKGROUND

Currently, as density of a single server becomes higher, how to solve a heat dissipation problem for a server has become a major difficulty during server chassis design. A heat dissipation system inside the server not only needs to ensure heat dissipation of a high-density hard disk area inside the server, but also needs to solve a heat dissipation problem of a high-power-consumption chip.

In an existing heat dissipation solution for a server, as shown in FIG. 1, a heat dissipation fan 12 is disposed in the middle of a server 11, a hard disk area is disposed in the front of the server, and a server mainboard and a high-power-consumption chip 13 are disposed at the back of the server. In such design, heat dissipation of both a hard disk 14 and the chip 13 is implemented by using the heat dissipation fan 12 in the middle. The heat dissipation fan 12 draws air backward, so that the air enters the server from the front of the server, first passes through the hard disk area in front of the fan to dissipate heat of the hard disk 14, and is then blown by the fan 12 to the mainboard and the chip 13 behind the fan 12 to dissipate heat of the chip 13.

In the foregoing existing server structure, because the heat dissipation fan is disposed in the middle of the server and the server mainboard is fixed at the back of the server, neither the heat dissipation fan nor the server mainboard can be replaced. When the heat dissipation fan or the server mainboard is faulty or needs to be maintained, the only way is to interrupt working of the server, take the server out of a cabinet, disassemble the server, and replace an entire server shelf, thereby lowering maintainability of the server.

SUMMARY

A technical problem to be solved in the present invention is to provide a server to solve a low maintainability and reliability problem of a server in the prior art, so that maintainability of a server is improved, a heat dissipation function of the server is ensured, and heat dissipation reliability of the server is improved through online replacement of a heat dissipation fan and a server mainboard.

To solve the foregoing technical problem, embodiments of the present invention adopt the following technical solution:

A server, including:

a chassis, a backplane with a ventilation opening, a rear board, a first air ducting apparatus, and at least one fan module, where:

the backplane, the rear board, the first air ducting apparatus, and the fan module are located in the chassis;

the backplane is located in the middle of the chassis, and the rear board is connected to a rear side of the backplane in a pluggable manner;

the fan module is disposed side by side with the rear board along a horizontal direction, and is connected to the rear side of the backplane in a pluggable manner; and the fan module includes: a fan and a second air ducting apparatus; and through rotation of the fan and cooperation between the second air ducting apparatus and the first air ducting apparatus, air that enters from the front of the backplane through the ventilation opening on the backplane turns towards the rear board and then flows out of the chassis after passing through the fan module, so as to dissipate heat of a component on the rear board.

With the server provided in the embodiment of the present invention, a fan module and a rear board are disposed side by side at the back of a backplane in a hot plug manner, so that the fan module or the rear board needs only to be drawn out of the back of the server during maintenance of the fan module or the rear board, thereby implementing online replacement of the fan module or the rear board. For a server in the prior art, the entire server needs to be disassembled to replace an entire chassis during maintenance of a fan module or a rear board. With the server provided in the embodiment of the present invention, maintainability of a server is greatly improved. In addition, by disposing a first air ducting apparatus and a second air ducting apparatus in a chassis, heat dissipation of a component such as a chip on a rear board is ensured while heat dissipation of a hard disk on a front board is implemented.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DETAILED DESCRIPTION

The embodiments of the present invention provide a server to solve a low maintainability and reliability problem of a server in the prior art, so that maintainability of a server is improved, a heat dissipation function of the server is ensured, and heat dissipation reliability of the server is improved through online replacement of a heat dissipation fan and a server mainboard.

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by persons of ordinary skill in the art based on the embodiments of the present invention without creative efforts shall fall within the protection scope of the present invention.

Figure 1:
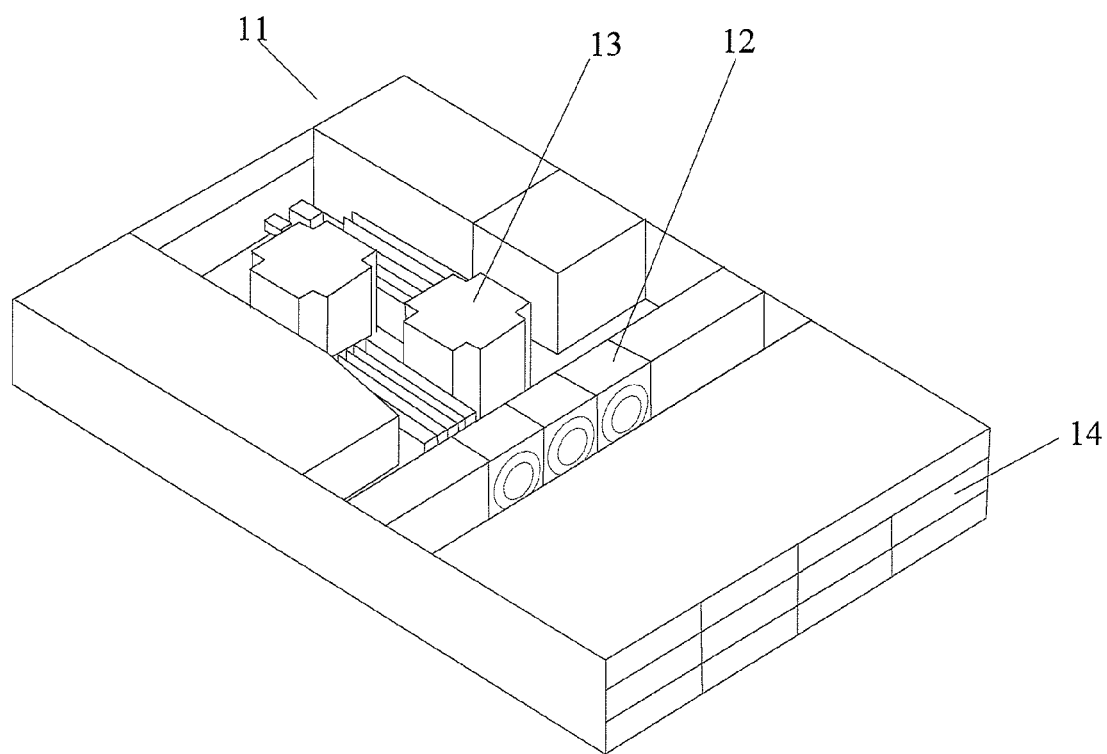
FIG. 1 is a schematic structural diagram of a server in the prior art.
Figure 2:
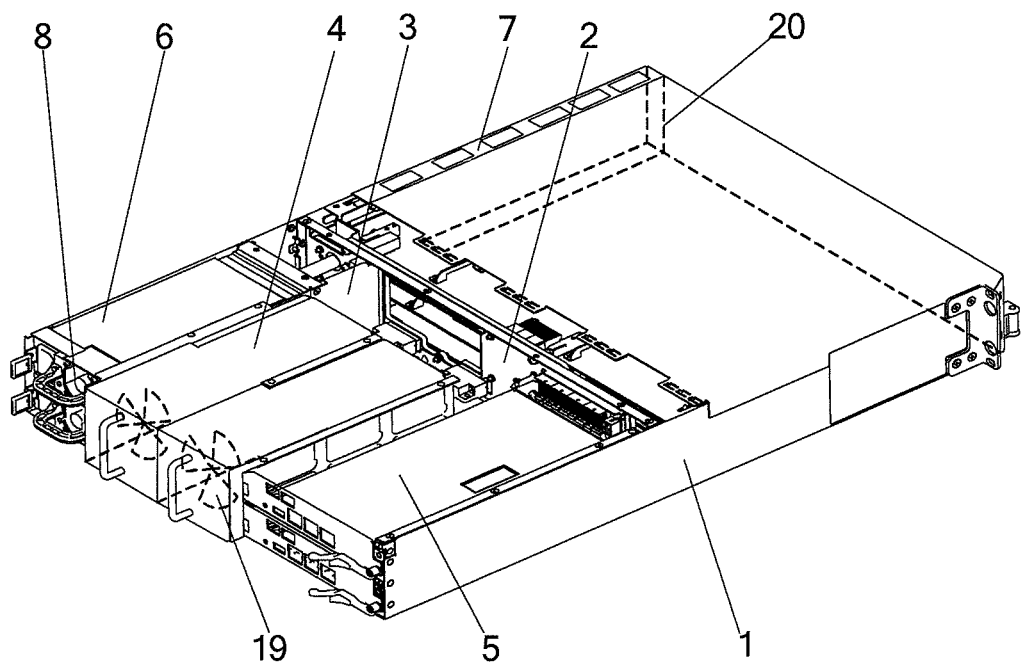
FIG. 2 is a schematic structural diagram of a server according to an embodiment of the present invention.

An embodiment of the present invention provides a server. As shown in FIG. 2, the server includes: a chassis 1, a backplane 2 with a ventilation opening, a rear board 5, a first air ducting apparatus 3, and at least one fan module 4, where the backplane 2, the rear board 5, the first air ducting apparatus 3, and the fan module 4 are located in the chassis 1.

In the server provided in this embodiment of the present invention, a hard disk is connected to a front board, a server mainboard is connected to the rear board, and the front board and the rear board are respectively located on two sides of the backplane and connected to the backplane. In this embodiment of the present invention, the server is inserted in a rack, and the hard disk is located at one end of the server and faces an opening of the rack, so that it is convenient for work personnel to perform maintenance on the hard disk. Therefore, in this embodiment of the present invention, an area in which the hard disk and the front board are located is defined as the front of the backplane, and the front board is inserted on a front side of the backplane. That is, the other side corresponding to the front board on the backplane is defined as a rear side of the backplane, and an area corresponding to the area in which the hard disk and the front board are located is the back of the backplane.

The backplane 2 is located in the middle of the chassis 1, and the rear board 5 is connected to the rear side of the backplane 2 in a pluggable manner.

The fan module 4 is disposed side by side with the rear board 5 along a horizontal direction, and is connected to the rear side of the backplane 2 in a pluggable manner.

The rear board 5 and the fan module 4 are disposed side by side at the back of the backplane 2 in a pluggable manner, and both the rear board 5 and the fan module 4 extend backward to a rear end of the chassis 2. When the rear board 5 or the fan module 4 needs to be maintained or replaced, the rear board or the fan module may be directly drawn out of the back of the server.

The fan module 4 includes: a fan 19 and a second air ducting apparatus; and through rotation of the fan 19 and cooperation between the second air ducting apparatus and the first air ducting apparatus 3, air that enters from the front of the backplane 2 through the ventilation opening on the backplane 2 turns towards the rear board 5 and flows out of the chassis after passing through the fan module 4, so as to dissipate heat of a component on the rear board 5.

In this embodiment of the present invention, the fan module 4 is formed by a fan box, a fan bracket, the fan, the second air ducting apparatus, and an interface. The fan is disposed in the fan box, the fan bracket is fixed on the chassis 1, the fan box can be inserted into the fan bracket, the second air ducting apparatus and the interface are disposed at a front end of the fan box, the second air ducting apparatus is opposite to the ventilation opening on the backplane 2, the interface is connected to the rear side of the backplane, and the backplane 2 supplies power to the fan inside the fan box through the interface.

In this embodiment of the present invention, a position at which the second air ducting apparatus is disposed is opposite to the ventilation opening on the backplane 2, and the first air ducting apparatus 3 is disposed on one side of the ventilation opening. Air enters the server from a front end of the server, first passes through the front board in front of the backplane 2 and a hard disk area on the front board, arrives at the backplane 2, and enters a rear area of the backplane 2 from the ventilation opening on the backplane 2. After passing through the first air ducting apparatus 3 and the second air ducting apparatus that is located at a front end of the fan module 4, the air passing through the ventilation opening turns towards the rear board 5 that is disposed side by side with the fan module 4, so as to dissipate the heat of the component on the rear board 5.

With the server provided in this embodiment of the present invention, a fan module and a rear board are disposed side by side at the back of a backplane in a hot plug manner, so that the fan module or the rear board needs only to be drawn out of the back of the server during maintenance of the fan module or the rear board, thereby implementing online replacement of the fan module or the rear board. For a server in the prior art, the entire server needs to be disassembled to replace an entire chassis during maintenance of a fan module or a rear board. With the server provided in this embodiment of the present invention, maintainability of a server is greatly improved. In addition, by disposing a first air ducting apparatus and a second air ducting apparatus in a chassis, heat dissipation of a component such as a chip on a rear board is ensured while heat dissipation of a hard disk on a front board is implemented.

In this embodiment of the present invention, the fan module 4 is located on at least one side of the rear board 5. That is, one or multiple fan modules 4 may be disposed on one side of the rear board 5, or one or multiple fan modules 4 may be disposed on each of two sides of the rear board 5. That is, when there are multiple fan modules, the multiple fan modules are disposed side by side on one side of the rear board along a horizontal direction, or one or multiple of the fan modules are disposed side by side on a left side of the rear board along a horizontal direction while the other one or multiple of the fan modules are disposed side by side on a right side of the rear board along a horizontal direction. Definitely, all these fan modules have corresponding air ducting apparatuses to cooperate with the first air ducting apparatus on the server, so that an air duct flows out of the chassis through the fan modules after turning towards the rear board. Persons of ordinary skill in the art may design a scheme of disposition on a single side or on left and right sides according to a record of the application document, which is not described herein again.

The server provided in this embodiment of the present invention further includes: a power module that is disposed inside the chassis 1 and connected to the rear side of the backplane. The power module includes: a power supply 6, a power fan 8, and an air duct 7. A first partition plate 20 is disposed in front of the backplane 2. The air duct 7 is formed between the first partition plate 20 and a side wall of the chassis 1 on a side on which the power module 4 is located. The power fan 8 guides air that enters from the air duct 7 to the power supply 6 so as to dissipate heat of the power supply 6.

The first partition plate 20 is disposed in front of the backplane 2 inside the chassis 1 of the server. The air duct 7 is formed between the first partition plate 20 and the side wall of the chassis 1. A position of the air duct 7 corresponds to a position of the power module at the back of the backplane 2. The air duct 7 is spaced from the area in which the hard disk and the front board of the server are located. At the back of the backplane 2, due to a space of the first air ducting apparatus 3, the air that enters from the air duct 7 is guided by the power fan 8 to dissipate the heat of the power supply 6. With such disposition, heat dissipation of the power module and heat dissipation of the rear board do not interfere with each other.

Figure 3:
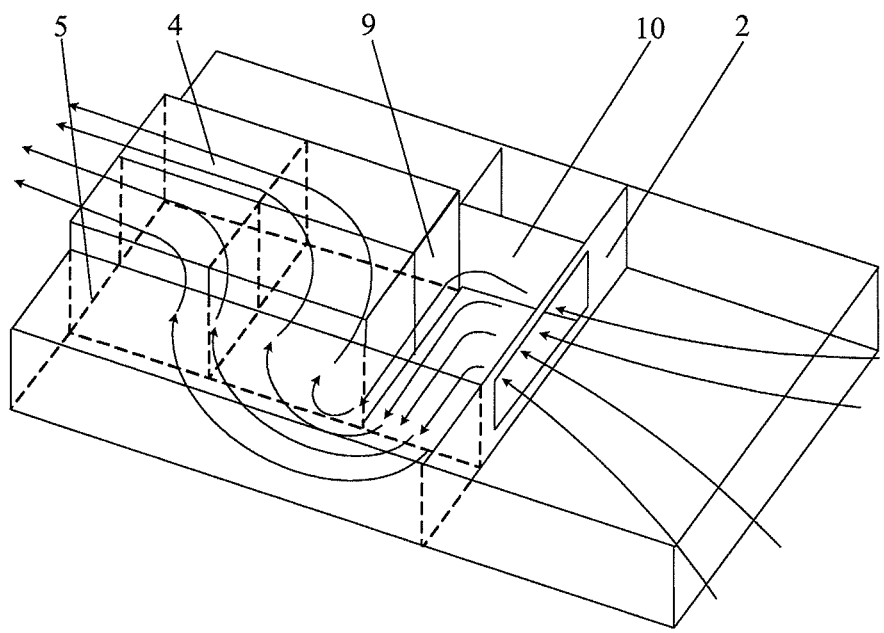
FIG. 3 is a diagram of air flow directions in a server according to an embodiment of the present invention.

In this embodiment of the present invention, as shown in FIG. 3, the first air ducting apparatus includes: a second partition plate 10, where the second partition plate 10 is vertically disposed on the rear side of the backplane 2 and located on a side of the ventilation opening on the backplane 2, where the side of the ventilation opening is opposite to a side on which the rear board 5 is located.

The second air ducting apparatus includes: a baffle plate 9, where the baffle plate 9 is parallel to the backplane 2 and disposed on a surface opposite to the ventilation opening on the backplane 2, a space is reserved between the baffle plate 9 and the backplane 2, and the baffle plate 9 is located at the front end of the fan module 4.

In this embodiment of the present invention, the baffle plate 9 may also be disposed inside the chassis, parallel to the backplane 2, and opposite to the ventilation opening on the backplane 2. A space is reserved between the baffle plate 9 and the backplane 2. The fan module 4 is disposed behind the baffle plate 9.

Air enters the server from the front end of the server (an air flow direction is shown by arrows in the figure), first passes through the front board in the front of the backplane 2 and the hard disk area on the front board, arrives at the backplane 2, and enters the rear area of the backplane 2 from the ventilation opening on the backplane 2. After passing through the second partition plate 10 and the baffle plate 9, the air passing through the ventilation opening turns towards the rear board 5 to dissipate the heat of the component on the rear board 5, and finally enters the fan module 4 and is discharged out of the server by the fan module 4.

Figure 4:
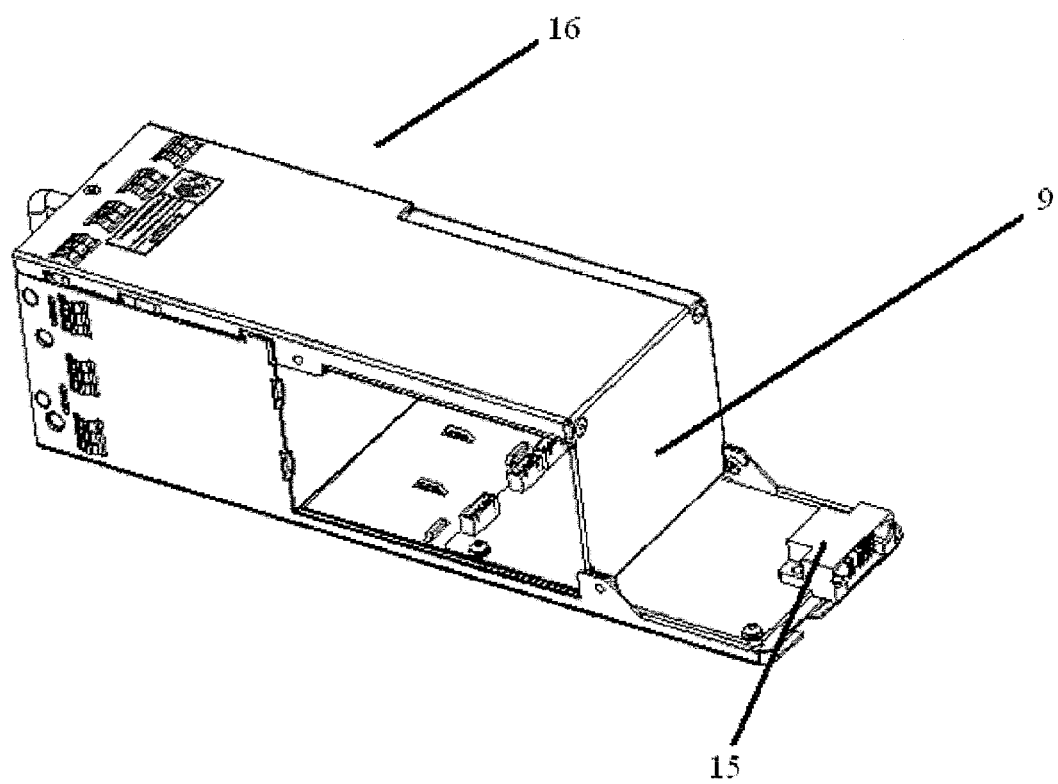
FIG. 4 is a schematic structural diagram of a fan box according to an embodiment of the present invention.

In this embodiment of the present invention, as shown in FIG. 4, the fan module includes: a fan box 16, where an air discharge vent is disposed at a rear end of the fan box 16, the baffle plate 9 is disposed at a front end of the fan box 16, the fan is disposed in a rear part of the fan box 16, and an opening is disposed on front left and right sides of the fan box 16. In this embodiment of the present invention, an interface 15 is further disposed at the front end of the fan box 16. The interface 15 may be connected to the backplane. The backplane supplies power to the fan inside the fan box 16 through the interface 15. In this embodiment of the present invention, the fan module further includes a fan bracket. The fan bracket is fixed on the chassis. The fan box 16 can be inserted into the fan bracket.

After dissipating heat of the rear board, the air that enters from the ventilation opening on the backplane enters the fan box 16 from an opening on one side of the fan box 16, and is then discharged out of the server through the air discharge vent at the rear end of the fan box 16.

As shown in FIG. 2, the server in this embodiment of the present invention includes two fan modules 4, two power modules, and two rear boards 5. The two rear boards 5 are stacked and located on one side of the two fan modules 4 that are placed side by side. The two power modules are stacked and located on the other side of the two fan modules 4 that are placed side by side. The two rear boards can back up data of each other. When the fan modules 4, the power modules, or the rear boards 5 inside the server need to be maintained, one of the fan modules 4, the power modules, or the rear boards 5 may be first taken out for maintenance. Because the other component in the server is still working, the maintenance does not affect a normal working status of the server. When one component is damaged, the other component can also ensure normal working of the server, thereby improving reliability of the server.

The server in this embodiment of the present invention further includes: a third air ducting apparatus, where the third air ducting apparatus is disposed inside the chassis and located on one side of the fan module, an elastic apparatus is disposed on the third air ducting apparatus so that the third air ducting apparatus springs up after the fan module is taken out, and the third air ducting apparatus is configured to enable, after the fan module is taken out, air that enters from the front of the backplane to turn towards the rear board, so as to dissipate the heat of the component on the rear board.

Figure 5:
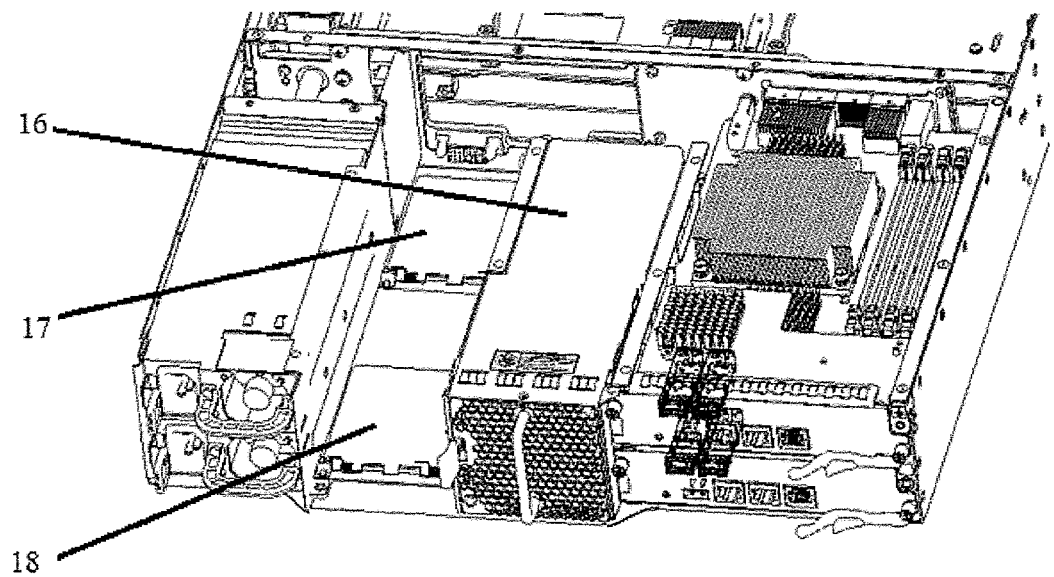
FIG. 5 is a schematic diagram of a status of a third air ducting apparatus before a fan module is taken out according to an embodiment of the present invention.

As shown in FIG. 5, in this embodiment of the present invention, the third air ducting apparatus includes: a front baffle plate 17, where the front baffle plate 17 is disposed on one side at a front end of the fan module along a flank of the fan module, and an elastic apparatus and a first rotating shaft are disposed at one end of the front baffle plate 17, so that after the fan module leaves a position in which the front baffle plate 17 is located, the front baffle plate 17 springs up, by using the first rotating shaft as an axis, to a position in which the second air ducting apparatus is located before the fan module is taken out.

Figure 6:
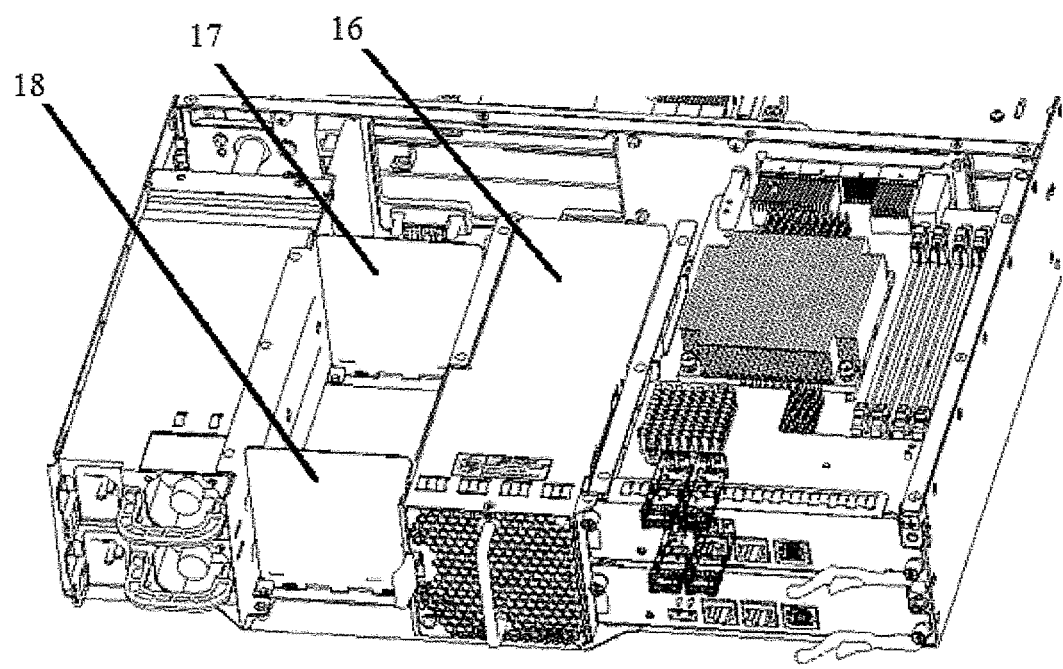
FIG. 6 is a schematic diagram of a status of a third air ducting apparatus after a fan module is taken out according to an embodiment of the present invention.

When the fan module is in the server, the front baffle plate 17 keeps in a horizontal status and is pressed by the fan box 16 onto the chassis of the server. When the fan module is drawn backward out of the server, that is, when the fan box 16 is pulled backward and leaves the position in which the front baffle plate 17 is located, as shown in FIG. 6, the front baffle plate 17 is no longer subject to a pressure of the fan box 16. The front baffle plate 17 springs up, by using the first rotating shaft as an axis, to a position in which the baffle plate of the second air ducting apparatus at the front end of the fan box 16 is located before the fan module is drawn out. A function of the front baffle plate 17 is to replace the baffle plate after the baffle plate is drawn out along with the fan box 16, so that the air that enters from the ventilation opening on the backplane turns towards the rear board. That is, it is ensured that a heat dissipation system of the server can work normally after one fan module is taken out, thereby improving heat dissipation reliability of the server.

In this embodiment of the present invention, as shown in FIG. 5, the third air ducting apparatus further includes: a rear baffle plate 18, where the rear baffle plate 18 is disposed on one side at a rear end of the fan module along a flank of the fan module, and an elastic apparatus and a second rotating shaft are disposed at one end of the rear baffle plate 18, so that after the fan module leaves a position in which the rear baffle plate 18 is located, the rear baffle plate 18 springs up, by using the second rotating shaft as an axis, to a position in which the rear end of the fan module is located before the fan module is taken out.

When the fan module is in the server, the rear baffle plate 18 keeps in a horizontal status and is pressed by the fan box 16 onto the chassis of the server. When the fan module is drawn backward out of the server, that is, when the fan box 16 is pulled backward and leaves the position in which the rear baffle plate 18 is located, as shown in FIG. 6, the rear baffle plate 18 is no longer subject to a pressure of the fan box 16. The rear baffle plate 18 springs up, by using the second rotating shaft as an axis, to a position in which the air discharge vent at the rear end of the fan box 16 is located before the fan module is drawn out. A function of the rear baffle plate 18 is to enclose, after the fan box is drawn out, an opening in which the original air discharge vent on the server is located, so as to prevent air outside the opening from being inversely absorbed into the server and affecting working of the heat dissipation system. That is, it is ensured that the heat dissipation system of the server can work normally after one fan module is taken out, thereby improving heat dissipation reliability of the server.

With the server provided in this embodiment of the present invention, two fan modules and two rear boards are disposed side by side at the back of a backplane in a hot plug manner, so that when one fan module or one rear board is damaged or needs to be maintained, the fan module or the rear board needs only to be drawn out from the back of the server without affecting normal working of the server, thereby implementing online replacement of the fan module or the rear board. For a server in the prior art, the entire server needs to be disassembled to replace an entire chassis during maintenance of a fan module or a rear board. With the server provided in this embodiment of the present invention, maintainability of a server is greatly improved. In addition, by disposing a second partition plate and a baffle plate in a chassis, heat dissipation of a component such as a chip on a rear board is ensured while heat dissipation of a hard disk on a front board is implemented. With the server according to this embodiment of the present invention, a third air ducting apparatus is disposed in fan modules, so that when one fan module is removed, a front baffle plate and a rear baffle plate spring up to enable a heat dissipation system of the server to keep normal working, thereby improving reliability of the heat dissipation system of the server.

According to the description of the foregoing embodiments, persons of ordinary skill in the art may clearly understand that the present invention may be implemented in a software plus necessary universal hardware manner, and definitely may also be implemented by hardware. In most cases, the former is preferred. Based on such an understanding, the technical solutions of the present invention essentially, or the part contributing to the prior art may be implemented in the form of a software product. The computer software product is stored in a readable storage medium, such as a floppy disk, a hard disk, or an optical disk of the computer, and includes several instructions for instructing a computer device (which may be a personal computer, a server, a network device, or the like) to perform the methods described in the embodiments of the present invention.

The foregoing descriptions are merely specific embodiments of the present invention, but are not intended to limit the protection scope of the present invention. Any variation or replacement readily figured out by persons skilled in the art within the technical scope disclosed in the present invention shall all fall within the protection scope of the present invention. Therefore, the protection scope of the present invention shall be subject to the protection scope of the claims.

What is claimed is:

1. A server, comprising:
a chassis, a backplane with a ventilation opening, a rear board, a first air ducting apparatus, a third air ducting apparatus, and a first fan module, wherein:
the backplane, the rear board, the first air ducting apparatus, and the first fan module are located in the chassis;
the backplane is located in the middle of the chassis, and the rear board is connected to a rear side of the backplane in a pluggable manner;
the first fan module is disposed side by side with the rear board along a horizontal direction, and is connected to the rear side of the backplane in a pluggable manner;
the first fan module comprises: a fan and a second air ducting apparatus; and through rotation of the fan and cooperation between the second air ducting apparatus and the first air ducting apparatus, air that enters from the front of the backplane through the ventilation opening on the backplane turns towards the rear board and then flows out of the chassis after passing through the first fan module, so as to dissipate heat of a component on the rear board; and
the third air ducting apparatus is disposed inside the chassis and located on one side of the first fan module, the third air ducting apparatus comprising an elastic apparatus to cause the third air ducting apparatus to spring up after the first fan module is removed from the chassis, the third air ducting apparatus being positioned, after the first fan module is removed, to direct air that enters from the front of the backplane to turn towards the rear board, so as to dissipate the heat of the component on the rear board.

2. The server according to claim 1, wherein:
the server comprises multiple fan modules and the first fan module is among the multiple fan modules, and
the multiple fan modules are disposed side by side on one side of the rear board along a horizontal direction, or
one or more of the multiple fan modules are disposed side by side on a left side of the rear board along a horizontal direction while another one or more of the multiple fan modules are disposed side by side on a right side of the rear board along a horizontal direction.

3. The server according to claim 1, further comprising:
a power module that is disposed inside the chassis and connected to the rear side of the backplane, wherein:
the power module comprises a power supply, a power fan, and an air duct;
a first partition plate is disposed in front of the backplane;
the air duct is formed between the first partition plate and a side wall of the chassis on a side on which the power module is located; and
the power fan guides air that enters from the air duct to the power supply so as to dissipate heat of the power supply.

4. The server according to claim 3, wherein the server comprises two such fan modules, two such power modules, and two such rear boards, and the two rear boards can back up data of each other.

5. The server according to claim 3, wherein the first air ducting apparatus comprises:
a second partition plate, wherein the second partition plate is vertically disposed on the rear side of the backplane and located on a side of the ventilation opening on the backplane, wherein the side of the ventilation opening is opposite to a side on which the rear board is located.

6. The server according to claim 1, wherein the second air ducting apparatus comprises:
a baffle plate, wherein the baffle plate is parallel to the backplane and a space is reserved between the baffle plate and the backplane.

7. The server according to claim 1, wherein the third air ducting apparatus further comprises:
a front baffle plate, wherein the front baffle plate is disposed on one side at a front end of the first fan module along a flank of the first fan module, and the elastic apparatus and a first rotating shaft are disposed at one end of the front baffle plate, so that after the first fan module leaves a position in which the front baffle plate is located, the front baffle plate springs up, by using the first rotating shaft as an axis, to a position in which the second air ducting apparatus is located before the first fan module is removed.

8. The server according to claim 1, wherein the third air ducting apparatus further comprises:

a rear baffle plate, wherein the rear baffle plate is disposed on one side at a rear end of the first fan module along a flank of the first fan module, and a second elastic apparatus and a second rotating shaft are disposed at one end of the rear baffle plate, so that after the first fan module leaves a position in which the rear baffle plate is located, the rear baffle plate springs up, by using the second rotating shaft as an axis, to a position in which the rear end of the first fan module is located before the first fan module is removed.

9. The server according to claim 6, wherein the first fan module further comprises a fan box, an air discharge vent is disposed at a rear end of the fan box, the baffle plate is disposed at a front end of the fan box, the fan is disposed in a rear part of the fan box, and an opening is disposed on front left and right sides of the fan box.

* * * * *